(12) United States Patent
Ivry (10) Patent No.: US 11,967,963 B2
(45) Date of Patent: Apr. 23, 2024

(54) HIGH PERFORMANCE FEEDBACK LOOP WITH DELAY COMPENSATION

(71) Applicant: MELLANOX TECHNOLOGIES, LTD., Yokneam (IL)

(72) Inventor: Raanan Ivry, Caesarea (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 17/690,063

(22) Filed: Mar. 9, 2022

(65) Prior Publication Data
US 2023/0291409 A1    Sep. 14, 2023

(51) Int. Cl.
*H03L 7/099* (2006.01)
*H02M 1/00* (2006.01)
*H03M 3/00* (2006.01)

(52) U.S. Cl.
CPC ........ *H03L 7/0994* (2013.01); *H02M 1/0003* (2021.05); *H03M 3/37* (2013.01)

(58) Field of Classification Search
None
See application file for complete search history.

(56) References Cited

U.S. PATENT DOCUMENTS

| | | | | |
|---|---|---|---|---|
| 6,943,610 B2* | 9/2005 | Saint-Laurent | ...... | H03K 5/1506 327/295 |
| 7,634,040 B1* | 12/2009 | Yang | ........ | H03L 7/091 375/376 |
| 8,120,518 B2* | 2/2012 | Jang | ........ | H03M 3/42 341/143 |
| 8,718,217 B2* | 5/2014 | Walker | ........ | H03L 7/0998 375/376 |

(Continued)

FOREIGN PATENT DOCUMENTS

JP    2018187266 A  *  11/2018

OTHER PUBLICATIONS

Richard, "Time-Delay Systems: An Overview of Some Recent Advances and Open Problems," Automatica 39 (2003), pp. 1667-1694, year 2003.

(Continued)

*Primary Examiner* — Thomas J. Hiltunen
*Assistant Examiner* — Khareem E Almo
(74) *Attorney, Agent, or Firm* — KLIGLER & ASSOCIATES PATENT ATTORNEYS LTD.

(57) ABSTRACT

An Integrated Circuit (IC) includes feedback control-loop (FCL) circuitry to generate a delay-compensated output signal responsively to an input reference signal. The FCL circuitry includes a main feedback path, a first subtractor, a delay-compensation feedback path, and a second subtractor. The main feedback path is to generate a main feedback signal responsively to the delay-compensated output signal. The first subtractor is to generate a non-compensated output signal responsively to a difference between the main feedback signal and the input reference signal. The delay-compensation feedback path is to generate a delay-compensation feedback signal responsively to the delay-compensated output signal. The second subtractor is to generate the delay-compensated output signal responsively to a difference between the non-compensated output signal and the delay-compensation feedback signal.

18 Claims, 10 Drawing Sheets

(56) References Cited

U.S. PATENT DOCUMENTS

| | | | |
|---|---|---|---|
| 9,559,836 B1 * | 1/2017 | Hata | H04L 7/0337 |
| 2006/0259806 A1 * | 11/2006 | Zweigle | G04R 40/02 |
| | | | 713/400 |
| 2009/0179707 A1 * | 7/2009 | Higashino | G11B 20/10046 |
| | | | 331/17 |
| 2017/0033801 A1 * | 2/2017 | Lo | H03M 3/50 |

OTHER PUBLICATIONS

Huang et al., "Robust Stability of Uncertain Time-Delay Systems," IEEE Transactions on Automatic Control, vol. 45, No. 11, pp. 2169-2173, Nov. 2000.

Mirkin et al., "Control Issues in Systems with Loop Delays", Handbook of Networked and Embedded Control Systems, pp. 1-22, year 2005.

Wilson et al., "Parameter Derivation of Type-2 Discrete-Time Phase-Locked Loops Containing Feedback Delays", IEEE Transactions on Circuits and Systems II: Express Briefs, vol. 56, issue 12, pp. 886-890, Dec. 2009.

Mansoor et al., "A New Method for Time-Delay Compensation in Control Systems", Iranian Journal of Chemistry and Chemical Engineering, vol. 27, No. 4, pp. 79-90, year 2008.

\* cited by examiner

HIGH PERFORMANCE FEEDBACK LOOP WITH DELAY COMPENSATION

FIELD OF THE INVENTION

The present invention relates generally to particularly to delay compensation in electronic control loops.

BACKGROUND OF THE INVENTION

Time-delay in control systems may bring about destabilizing effects and, consequently, slow loop response. In "Time-delay systems: an overview of some recent advances and open problems", J. P. Richard (Automatica 39 (2003), pages 1667-1694) the author presents some motivations for the study of time-delay systems, and then recalls modifications (models, stability, structure) arising from the presence of the delay phenomenon. A brief overview of some control approaches is then provided. Lastly, some open problems are discussed, including the constructive use of the delayed inputs, the digital implementation of distributed delays, the control via the delay, and the handling of information related to the delay value.

In "Robust Stability of Uncertain Time-Delay Systems", Huang and Zhou (IEEE Transactions on Automatic Control, VOL 45, NO 11, November 2000, pages 2169-2173) the authors consider the robust stability and control of uncertain time-delay systems and derive sufficient stability conditions using the small $\mu$ theorem. The authors then show that most existing literature results are much more conservative than this condition.

Lastly, in "Control Issues in Systems with Loop Delays", L. Mirkin and Z. Palmor (Handbook of Networked and Embedded Control Systems, 2005, pages 627-648), the authors discuss properties of feedback control systems containing loop delays (dead-time systems) and approaches to controller design for such systems.

SUMMARY OF THE INVENTION

An embodiment of the present invention that is described herein provides an Integrated Circuit (IC) including feedback control-loop (FCL) circuitry, which is to generate a delay-compensated output signal responsively to an input reference signal. The FCL circuitry includes a main feedback path, a first subtractor, a delay-compensation feedback path, and a second subtractor. The main feedback path is to generate a main feedback signal responsively to the delay-compensated output signal. The first subtractor is to generate a non-compensated output signal responsively to a difference between the main feedback signal and the input reference signal. The delay-compensation feedback path is to generate a delay-compensation feedback signal responsively to the delay-compensated output signal. The second subtractor is to generate the delay-compensated output signal responsively to a difference between the non-compensated output signal and the delay-compensation feedback signal.

In some embodiments, the delay-compensation feedback path includes an integrator. In some embodiments, the delay-compensation feedback path includes an accumulator. In some embodiments, the delay-compensation feedback path includes a signal multiplier.

In disclosed embodiments, the FCL circuitry includes a phase-locked-loop (PLL). In an example embodiment, the PLL is distributed. In an embodiment, the PLL includes a multistage distributed PLL. In other embodiments, the FCL circuitry includes a clock and data recovery (CDR) circuit.

There is additionally provided, in accordance with an embodiment of the present invention, a method for generating a delay-compensated output signal responsively to an input reference signal. The method includes generating a main feedback signal responsively to the delay-compensated output signal, using a main feedback path. A non-compensated output signal is generated using a first subtractor responsively to a difference between the main feedback signal and the input reference signal. A delay-compensation feedback signal is generated using a delay-compensation feedback path responsively to the delay-compensated output signal. The delay-compensated output signal is generated responsively to a difference between the non-compensated output signal and the delay-compensation feedback signal, using a second subtractor.

The present invention will be more fully understood from the following detailed description of the embodiments thereof, taken together with the drawings in which:

DETAILED DESCRIPTION OF EMBODIMENTS

Overview

Delay in feedback-control loops (FCLs) typically degrades the performance and the stability of the FCLs. In many applications, however, the delay is intrinsic and cannot be avoided.

Embodiments of the present invention that are disclosed herein provide circuits and methods to compensate for delay in FCLs. The disclosed techniques may be applicable to various types of FCLs, including, for example, Phased-Locked-Loop (PLL), Automatic Gain Control (AGC), Clock and Data Recovery (CDR) and others. We will refer hereinbelow to the signal that the controlled entity of the FCL generates as the "output signal", and to the control signal as the "feedback signal".

The example embodiments described herein refer mainly to FCLs that comprise an integrator to integrate the feedback signal.

In embodiments, the effect of the delay can be compensated by subtracting a delay-compensation signal from the output signal. In some embodiments, the delay compensation signal is created by integrating the feedback signal over a period that is equal to the delay of the PCL.

In an embodiment, the feedback integration period is shorter than the delay of the FCL; the full integration compensation is approximated by multiplying the feedback integration path by a constant.

In another embodiment, the integration is approximated by multiplying a level of the feedback signal (e.g., the current level) by the width of the integration period (e.g., the delay of the FCL, multiplied by a correction factor).

In certain embodiments, some or all the FCL circuits may be implemented in the digital domain. In an embodiment, the delay compensation is performed in the digital domain; the FCL comprises analog to digital and digital to analog converters, and the integration is done by a digital accumulator.

In yet other embodiments, the FCL is a Phased Locked Loop, comprising a Voltage-Controlled Oscillator (VCO) that generates a clock signal (the output signal), a Phase Detector (PD) and a loop-filter. The loop-filter applies a loop function to the PD output; the VCO integrates the output of the loop-filter and modifies the frequency of the clock signal according to the integration value. In embodiments, the VCO and the PD may be remote from one another, and both the clock signal and the feedback signal may be delayed. For compensation, the FCL comprises an integrator that integrates the feedback signal during a preceding period that is equal to the FCL delay, and a phase interpolator (PI), to subtract the integrated feedback signal from the phase of the VCO output signal.

In an embodiment, a distributed PLL is used, with a single VCO that generates a clock signal, and a plurality of circuit that use the clock ("consumer circuits", or "consumers"). The clock propagates ("daisy-chained") between from a first consumer to a last consumer. The loop filter is implemented in the last consumer, and the feedback signal propagates back from the last to the first consumer, and thenceforth to the VCO control input. Both the clock signal and the feedback are delayed when propagating between the consumers. To compensate for the delay, each consumer comprises an integrator and a PI; the integrator integrates the feedback signal during a preceding period that is equal to the sum of the delays of the clock signal and the feedback signal, from the consumer to the VCO.

Lastly, some embodiments compensate for intrinsic delays of Clock and Data Recovery (CDR) circuits. In an embodiment, a Digitally Controlled Oscillator (DCC) generates a sampling clock output; an analog to digital converter (ADC), clocked by the sampling clock, converts a high-speed analog input signal to a digital signal, and a Feed-Forward Equalizer (FFE) equalizes the ADC output. A PI then subtracts a phase Φ from the FFE output, to compensate for delays in the CDR. The output of the PI is the recovered clock signal. A PD detects the phase of the recovered clock, sends the phase to a loop-filter, which generates a feedback signal to control the DCC phase (the DCO comprises an integrator that generates frequency from the phase input). To generate the delay correction phase Φ, an integration of the feedback signal during a preceding period that is equal to the CDR delay is approximated by the current value of the feedback signal, multiplied by a constant.

In an alternative CDR embodiment, a subtractor is used to subtract the delay compensation phase from a PD that is coupled directly to the PD (the PI is used for the output signal only). Thus, a shorter loop delay is achieved, and in another alternative embodiment the compensation path comprises an integrator and a multiplier.

In summary, in the disclosed embodiments, delays of an FCL are compensated for by subtracting a partial integration from the forward signal; various embodiments disclose techniques to obtain (or to approximate) the partial integration, and to subtract the partial integration from the forward path, in a variety of FCL types.

The disclosed techniques are useful, for example, to compensate for intrinsic delays of FCLs. As a result, FCLs can achieve higher accuracy and higher stability, and operate at higher bandwidths that otherwise possible.

System Description

Feedback control loops are widely use in various electronic and mechanical systems. The description hereinbelow refers mainly to feedback control loops that comprise an integrator in the feedback path.

Figure 1:
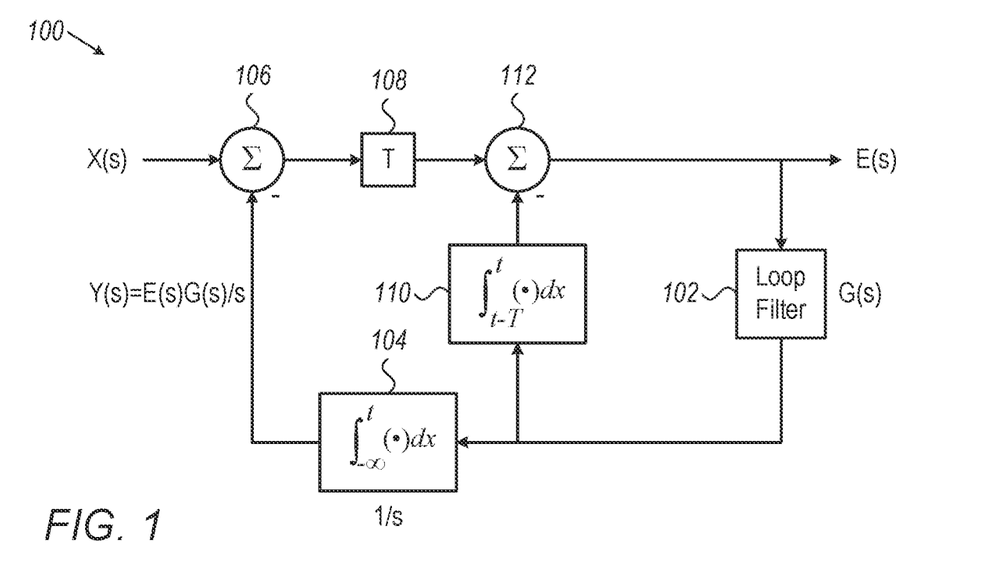
FIG. 1 is a block diagram that schematically illustrates a Feedback Control Loop (FCL) with delay compensation, in accordance with an embodiment of the present invention.

FIG. 1 is a block diagram that schematically illustrates a Feedback Control Loop (FCL) 100 with delay compensation, in accordance with an embodiment of the present invention. FCL 100 may be, for example, a Phased-Locked Loop (PLL) or any other suitable electronic or mechanical feedback control loop.

PCI 100 comprises a loop filter 102, which may be, for example, a second order filter; an integrator 104, which is configured to integrate the feedback signal; and a summing node 106, which is configured to subtract an error signal (e.g., the integrator output) from the input.

We denote the input signal $X(s)$, the output signal $E(s)$, the error signal $Y(s)$ and the transfer function of Loop Filter 102 $G(s)$. The transfer function of integrator 104 is $1/s$ and, hence, $Y(s)=E(s)(s)/s$.

Note that forward gain is not explicitly shown in FIG. 1 (and in further figures) because it is not relevant to the loop descriptions below; a forward gain may be, for example, built in loop filter 102.

In practice, FCL 100 comprises an intrinsic delay T 108. The delay typically stems from physical limitations of the circuits being used (e.g., delay of detector circuits). This delay may impair the performance of the FCL (e.g., cause oscillations). The effect of the delay at the output of T 108 is that the current t is moved forward by T, and, hence, the integral value that was subtracted from $X(s)$ lacks the integration from t-T to t.

To compensate for the delay, FCL 100 comprises an integrator 110, which integrates the output of the loop filter during a preceding time interval that is equal to T; and a subtractor 112 which subtracts the output of integrator 110 from the delayed output of subtractor 106. Thus, according to the example embodiment illustrated in FIG. 1 and described above, the effects of the intrinsic delay T may be fully compensated for.

The feedback path, through integration 104, will be sometimes referred to as "the main feedback path", and the signal that loop filter 102 generates will be sometimes referred to as "the feedback signal". The delay compensation path, through integrator 110, will be sometimes referred to as "delay-compensation feedback path".

In some embodiments, T is not exactly identical to the integration period of integrator 110 (for example, when T is not known, or changes over time). In such a case, delay compensation is still effective, possibly with some degradation. In other words, even when the integration period of integrator 110 differs slightly from T, at least some of the FCL delay is compensated for. This property also applies to the alternative embodiments described below.

Figure 2A:
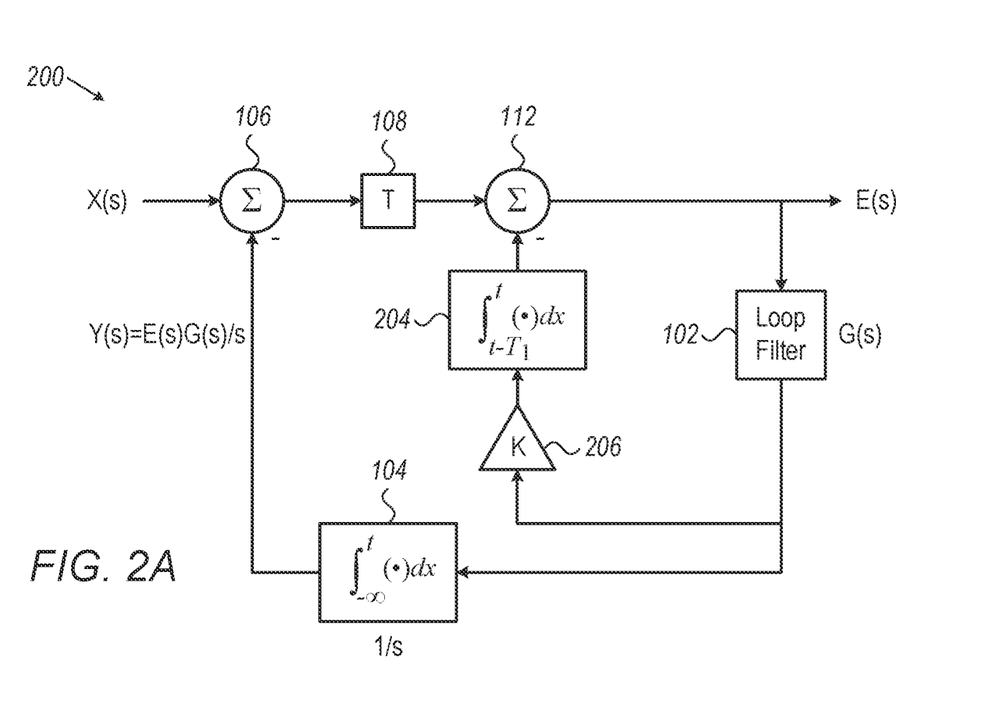
FIG. 2A is a block diagram that schematically illustrates an FCL with simplified delay compensation that includes a compensation integrator, in accordance with an embodiment of the present invention.

FIG. 2A is a block diagram that schematically illustrates an FCL 200 with simplified delay compensation that includes a compensation integrator, in accordance with an embodiment of the present invention. FCL 200 is like FCL 100 and includes an integrator 204. The integration period (T1), however, may be shorter than loop delay T. For improved compensation, FCL 200 further comprises a multiplying-amplifier K 202, which multiplies the feedback signal, by a correction factor K (typically K=T/T1).

Figure 2B:
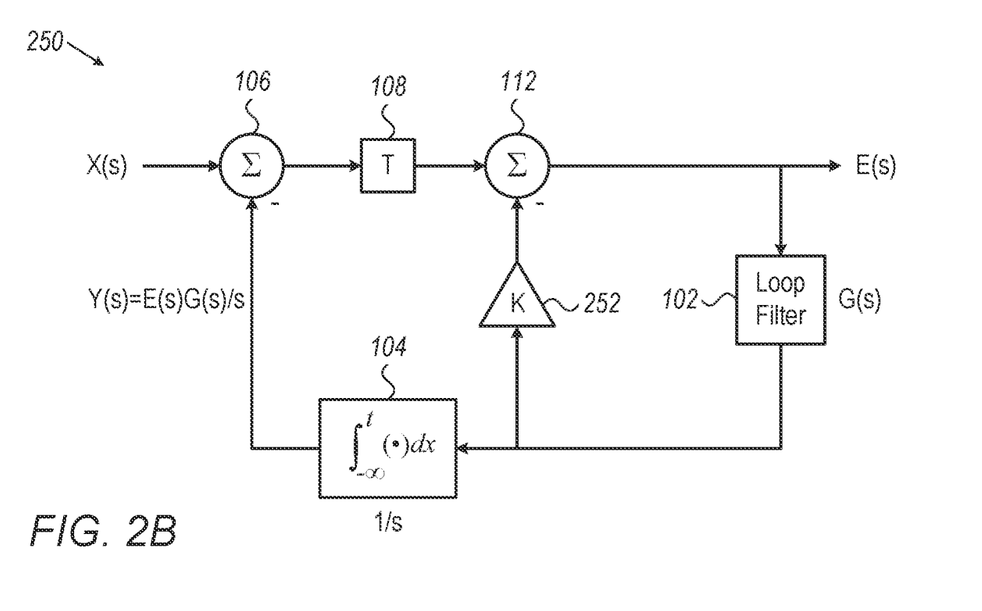
FIG. 2B is a block diagram that schematically illustrates an FCL with simplified delay compensation that does not include a compensation integrator, in accordance with an embodiment of the present invention.

FIG. 2B is a block diagram that schematically illustrates an FCL 250 with simplified delay compensation that does not include a compensation integrator. FCL 250 is like FCL 100, but integrator 110 (FIG. 1) is replaced with a multiplying-amplifier K 252. Assuming the changes in the signal level during the time T are low, integration can be approximated by a multiplication of the signal level and a constant that is proportional to the time duration T. Thus, the delay compensation technique illustrated in FIG. 1 can be economically approximated without an integrator.

The configuration of FCLs 200 and 250, illustrated in FIGS. 2A, 2B and described above are example configurations that are cited for conceptual clarity. Other configurations can be used in alternative embodiments. For example, in some embodiments, in FCL 250, a delay that is equal to T/2 is applied on the feedback signal, and the multiplying amplifier multiplies the delayed feedback signal by K; thus, the integration is approximated by multiplying the signal at the middle of the integration period by T, for better accuracy.

Figure 3:
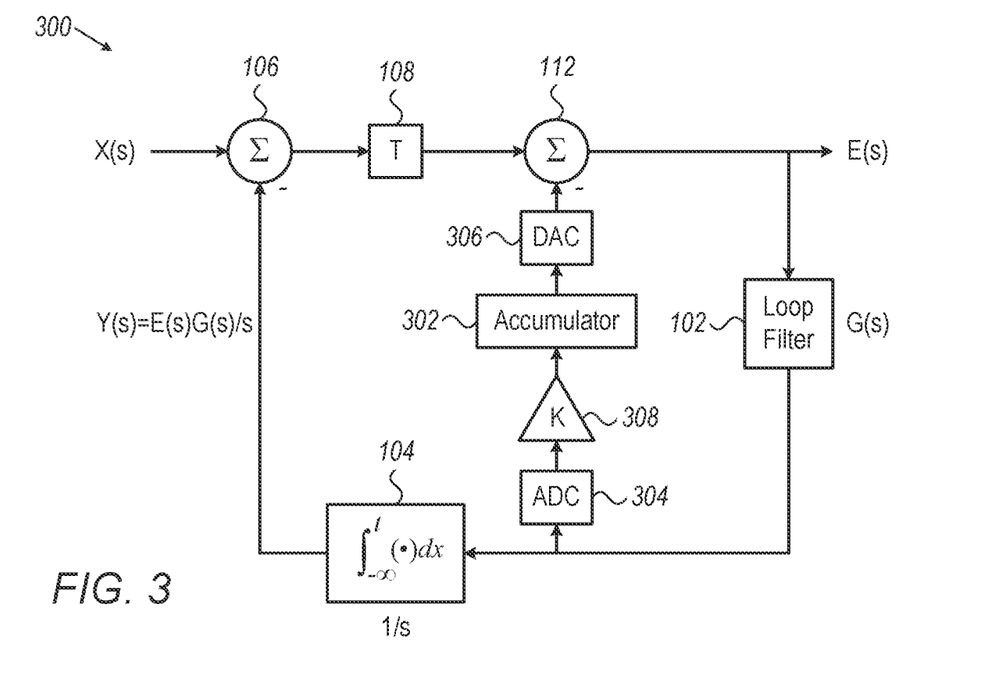
FIG. 3 is a block diagram that schematically illustrates an FCL with digital delay compensation, in accordance with an embodiment of the present invention.

FIG. 3 is a block diagram that schematically illustrates an FCL 300 with a digital delay compensation, in accordance with an embodiment of the present invention. FCL 300 is like FCL 100, but integrator 110 is replaced by an accumulator 302 in the digital domain. An Analog to Digital (ADC) converter 304 converts the output of loop-filter 102 to a digital signal, and a digital to analog converter (DAC) 306 converts the digital output of the accumulator to an analog signal. K is a digital multiplier, that multiplies the digital signal that ADC 304 produces by a constant K, that is inversely proportional to the sampling period of ADC 304. Accumulator 302 is configured to sum the N last signal values that amplifier K outputs, where N=T/(ADC sampling period).

The configuration of FCL 300 illustrated in FIG. 3 and described hereinabove is cited by way of example for the sake of conceptual clarity. Other configurations may be used in alternative embodiments. For example, while in FCL 300 only the accumulation is done in the digital domain, in other embodiments, loop filter 102 and/or integrator 104 are in the digital domain, and the location of ADC 304 and DAC 306 change accordingly; in yet other embodiments, other parts may be digital, including an embodiment in which the complete FCL is digital, including X(s) and E(s) (in practice, mixed analog-digital embodiments may be rare).

Figure 4:
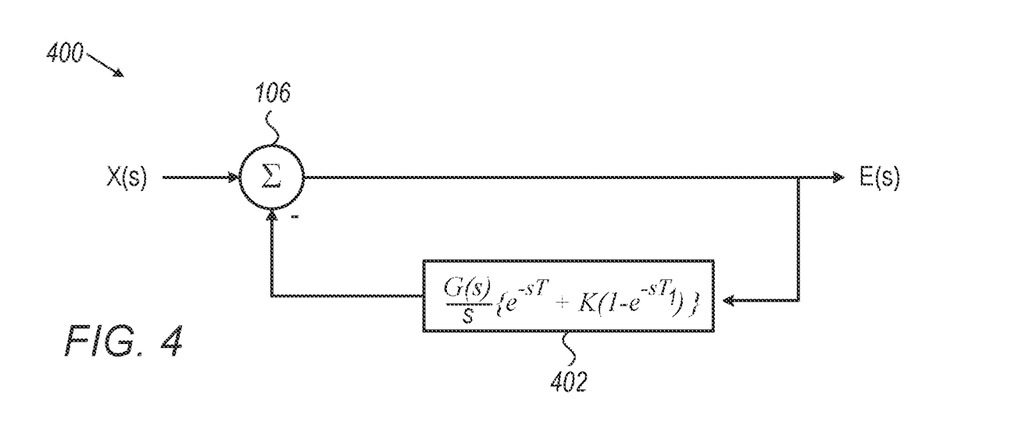
FIG. 4 is a block diagram that schematically illustrates a mathematical representation of an FCL, in accordance with an embodiment of the present invention.

FIG. 4 is a block diagram that schematically illustrates a mathematical representation 400 of an FCL, in accordance with an embodiment of the present invention. FCL 400 is mathematically equivalent to FCL 200, FIG. 2. The transfer function of the feedback path is $$\frac{G(s)}{s}\left\{e^{-sT} + K\left(1 - e^{-sT_1}\right)\right\}  \qquad \text{(Equation 1)}$$

wherein T is the loop delay, $T_1$ is the sampling time when no accumulator is used, or N*sampling time if an accumulator is used (N was defined above, with reference to FIG. 3). K is set to $T/T_1$.

It should be noted that, in embodiments, either direct analog signals or sampled analog signals may be used. An integration of direct analog signal may be replaced by addition of analog samples, adjusted by a suitable constant.

Simulation Results

We now present MATLAB simulation results of FCL 400. The simulation runs assume a second order ideal FCL with G(s)=5.2*$10^7$+(1.4*$10^{15}$/s), and a delay T=5*$10^{-9}$ seconds. We analyze the FCL performance with no delay (T=0), with delay T but without delay compensation, with partial delay compensation using integration interval=T/5 and with partial delay compensation using integration interval=T/15 (the analysis for full compensation, with integration interval=T, is identical to the performance with no delay).

Figure 5A:
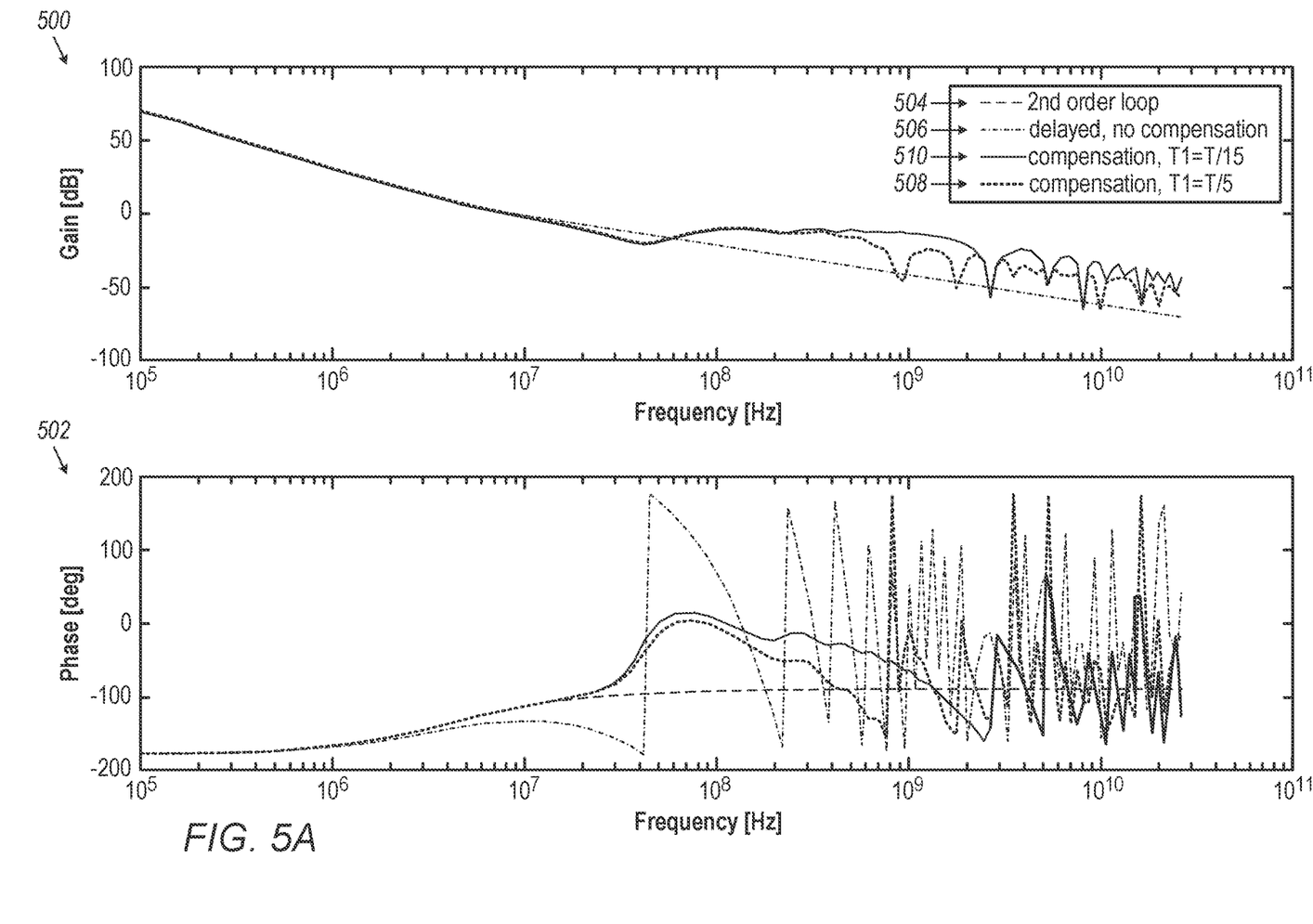
FIG. 5A is a graphical illustration of a stability analysis of an FCL, in accordance with an embodiment of the present invention.

FIG. 5A is a graphical illustration of a stability analysis of an FCL, in accordance with an embodiment of the present invention. The analysis includes a gain 500 and phase 502, that were calculated using MATLAB software.

Curves 504 illustrate the gain and phase responses of the second order FCL, without delay; the loop is stable in all frequencies. Curves 506 illustrate the gain and the phase responses of the second order FCL with delay, and without compensation. As can be seen from the frequency response, the PCI becomes instable at roughly 40 MHz.

Curves 508 illustrates the gain and phase responses of the second order FCL, with delay compensation integrator (according to the equivalent circuit 400, FIG. 4), wherein $T_1$=T/5. The FCL is now stable up to about 600 MHz.

Lastly, curves 510 illustrate the gain and phase responses of the second order PCI, with the delay compensation integrator, wherein $T_1$=T/15. The PCI is now stable up to about 2500 MHz.

Figure 5B:
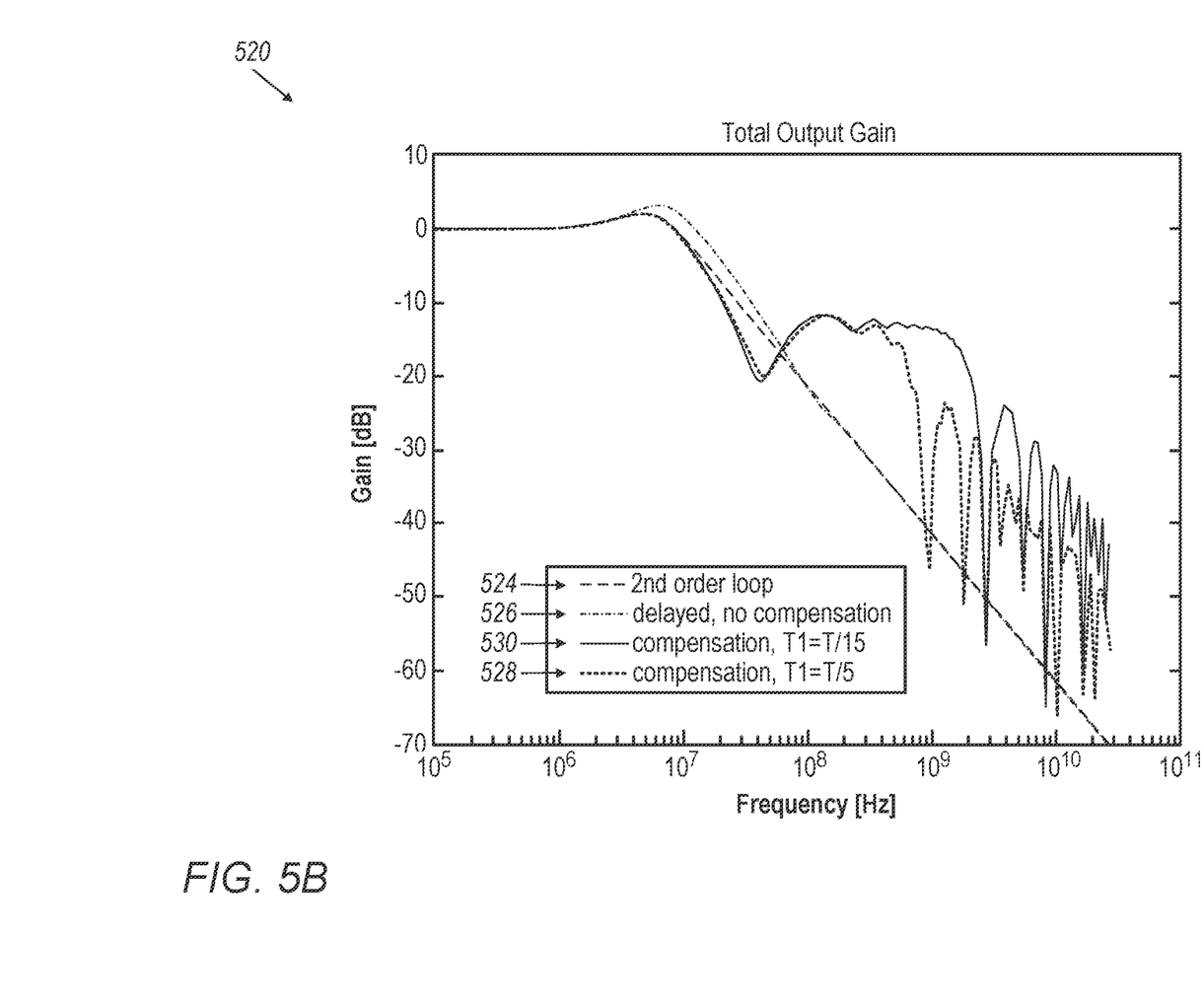
FIG. 5B is a graphical illustration of a total output gain analysis of an FCL, in accordance with an embodiment of the present invention.

FIG. 5B is a graphical illustration 520 of a total output gain analysis of an FCL, in accordance with an embodiment of the present invention. The analysis was calculated using MATLAB software. A curve 524 illustrates the total output gain for the second order FCL, without delay; a curve 526 illustrates the total output gain for the second order FCL with delay, and without compensation. A curve 528 illustrates the total output gain of the second order FCL, with a delay compensation integrator, and with $T_1$=T/5; and, lastly, A curve 530 illustrates the total output gain of the second order FCL, with a delay compensation integrator, and with $T_1=T/15$. As can be observed, the total output gain of the delay-compensated FCL is lower than the delay of an ideal FCL (with no delay) by up to 6 dB between 10 to 60 MHz; above 60 MHz the total output gain for curve 530 is always better than the gain of the ideal FCL; the gain for curve 523 is better than that of the ideal FCL, except That in five discrete frequencies, starting with 900 MHz, the gain is lower than that of the ideal FCL by 5 dB to 7 dB.

Figure 5C:
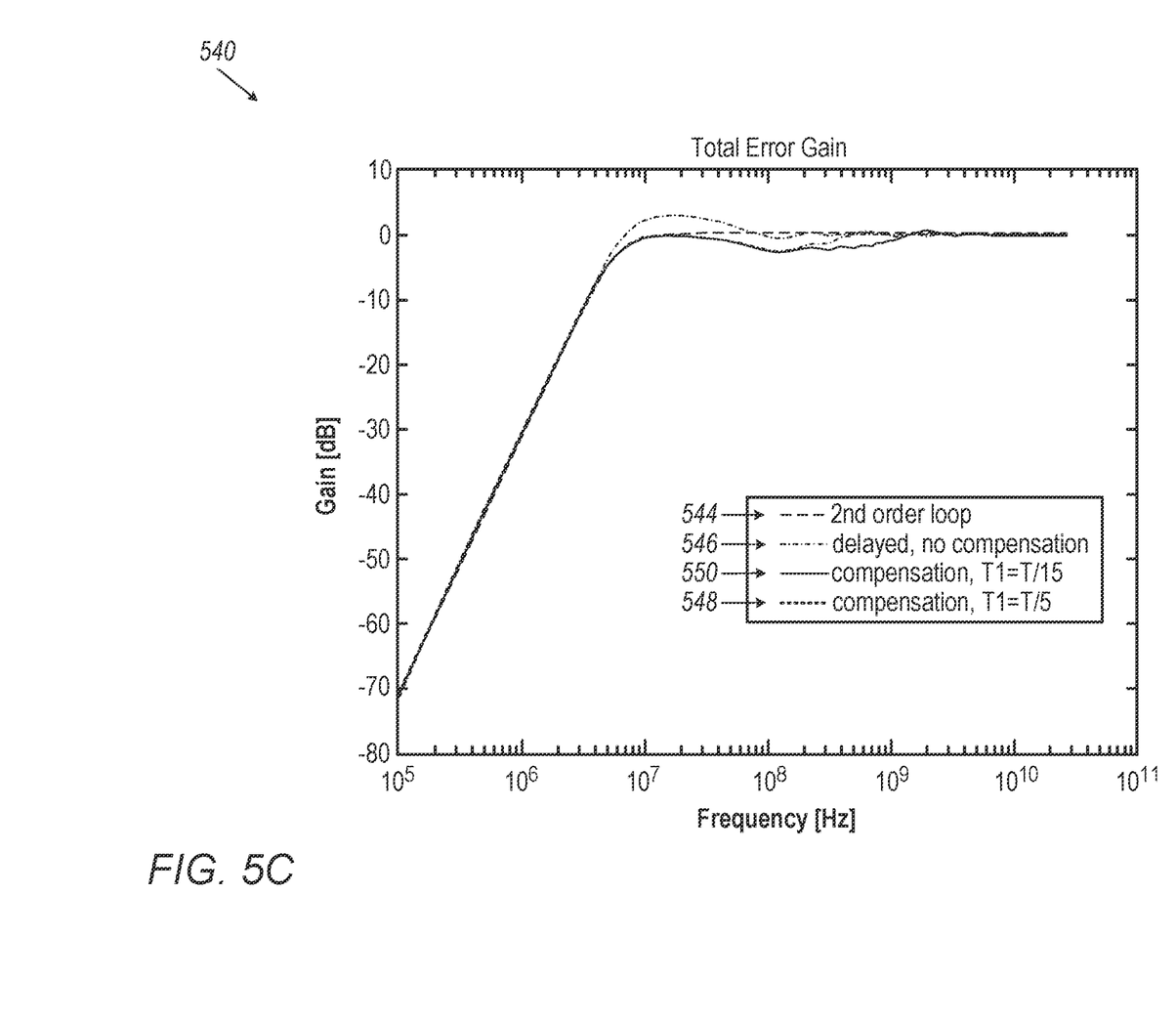
FIG. 5C is a graphical illustration of a total error gain analysis of an FCL, in accordance with an embodiment of the present invention.

FIG. 5C is a graphical illustration 540 of a total error gain analysis of an FCL, in accordance with an embodiment of the present invention. The analysis was calculated using MATLAB software. A curve 544 illustrates the total error gain for the second order FCL, without delay; a curve 546 illustrates the total error gain for the second order FCL with delay, and without compensation. A curve 548 illustrates the total error gain of the second order FCL, with delay compensation integrator, and with $T_1=T/5$; and, lastly, A curve 550 illustrates the total error gain of the second order FCL, with delay compensation integrator, and with $T_1=T/15$. As can observed, the error gain of the delay-compensated FCL is better than or equal to the error gain of the ideal FCL, except that in some frequencies above 600 MHz the ideal-FCL error gain may be higher, by about 0.5 dB.

Figure 6:
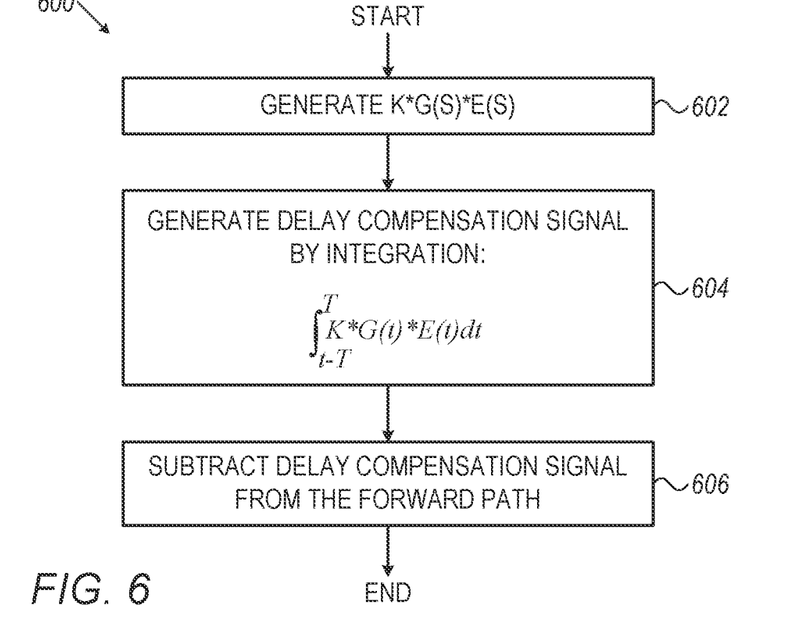
FIG. 6 is a flowchart that schematically illustrates a method for delay compensation in an FCL, in accordance with an embodiment of the present invention.

FIG. 6 is a flowchart 600 that schematically illustrates a method for delay compensation in an FCL, in accordance with an embodiment of the present invention. The flowchart is executed by an FCL (e.g., FCL 100, FIG. 1).

The flowchart starts at a Generate-Adjusted-Feedback-Signal stage 602, wherein the FCL multiplies the output of the loop filter 102 (FIG. 1)—E(s)*G(s), by a constant K. In embodiments, stage 602 is done in the digital domain, and an analog to digital conversion is applied on either E(s) (the output signal) or on E(s)*G(s) (the feedback signal), and K is set to the ratio between the ADC sampling period and T. In other embodiments analog signals are used, and K equals 1.

Next, at an Integrate stage the FCL integrates the multiplication of stage 602, from the current time minus T to the current time. In some embodiments the integration comprises accumulating digital values, and in other embodiments the integration is done by analog means, e.g., by accumulating charge in a capacitor.

Lastly, in a Subtract Compensation stage 606, the FCL subtracts the integration from the output signal, to compensate for the intrinsic delay T of the PCI.

Compensating for Phased-Locked-Loop (PLL) Delay

Phase-locked loops (PLLs) typically comprise a voltage-control oscillator (VCO) and a phase detector, which subtracts the phase of the oscillator output from the phase of a reference oscillator. The difference between the phases is fed back to the VCO control voltage, and the VCO typically comprises an integrator that integrates the feedback voltage and outputs a frequency responsively to the integral (e.g., a frequency that is proportional to the integral of the feedback voltage). The PLL, hence, is a feedback-control loop (FCL).

In typical applications, the PLL also comprises frequency dividers, which divide the frequency of the VCO and/or the frequency of the reference oscillator by n and m, respectively. The PLL then adjusts the VCO frequency so that $F_{out}/n=F_{ref}/m$; or $F_{out}=F_{ref}*n/m$; thus, various frequencies can be synthesized by modifying n and m.

In practical implementation, PLL circuits comprise delays. The effect of delays on PLLs is analyzed, for example, in "Parameter Derivation of Type-2 Discrete-Time Phase-Locked Loops Containing Feedback Delays", Wilson et. al, IEEE Transactions on Circuits and Systems II: Express Briefs (Volume: 56, Issue: 12, December 2009, pages 886-1890).

The delay-compensation techniques disclosed above can be used to compensate for the intrinsic delays of PLLs.

Figure 7:
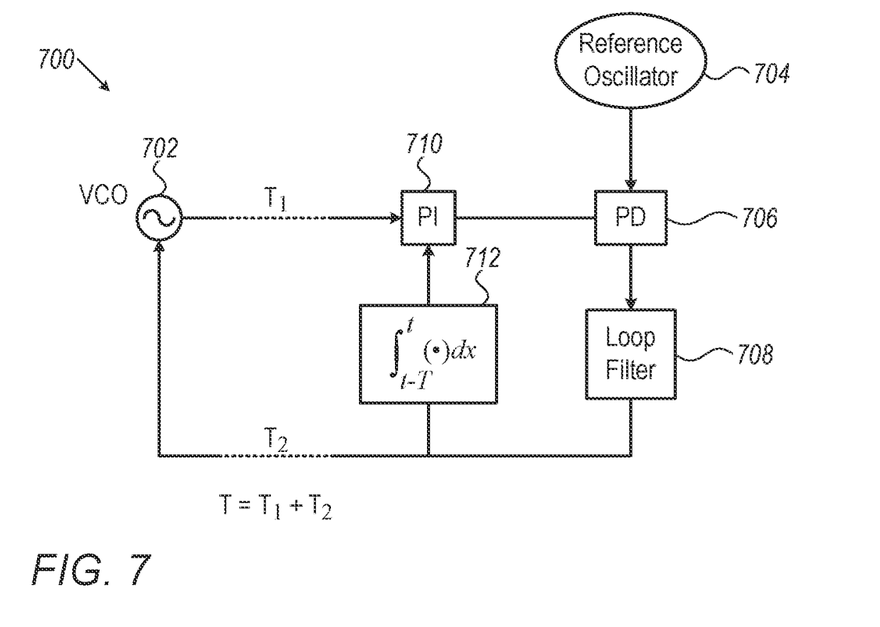
FIG. 7 is a block diagram that schematically illustrates a delay compensated Phase-Lock-Loop (PLL), in accordance with an embodiment of the present invention.

FIG. 7 is a block diagram that schematically illustrates a delay compensated PLL 700, in accordance with an embodiment of the present invention. PLL 700 comprises a VCO 702, a Reference Oscillator 704, a Phase Detector 706 and a Loop Filter 708. The frequency that VCO 702 outputs is controlled by the voltage that Loop Filter 708 outputs; in embodiments the VCO integrates the loop filter output, and the integrated voltage controls the frequency of the VCO. Phase Detector 706 compares the phases of the VCO and Reference Oscillator 704.

In embodiments, the PLL may comprise intrinsic delays—a delay T1 between the VCO and the phase detector, and a delay T2 between the loop-filter and the VCO control input. To compensate for the delay, PLL 700 further comprises an integrator 712 and a phase interpolator 710, which is configured to subtract a phase that is equal to the output of integrator 712 from the VCO output. The integrator integrates the output of the loop-filter from t-T to t, wherein t is the current time and T is the sum of the delays: $T=T1+T2$.

In embodiments, the PLL may be distributed in the sense that the VCO output (referred to as Clock hereinbelow) propagates between circuits that use the clock ("consumers"), from a first consumer to a last consumer. Delays of the clock, as well as delays of the VCO control voltage, are also distributed.

Figure 8:
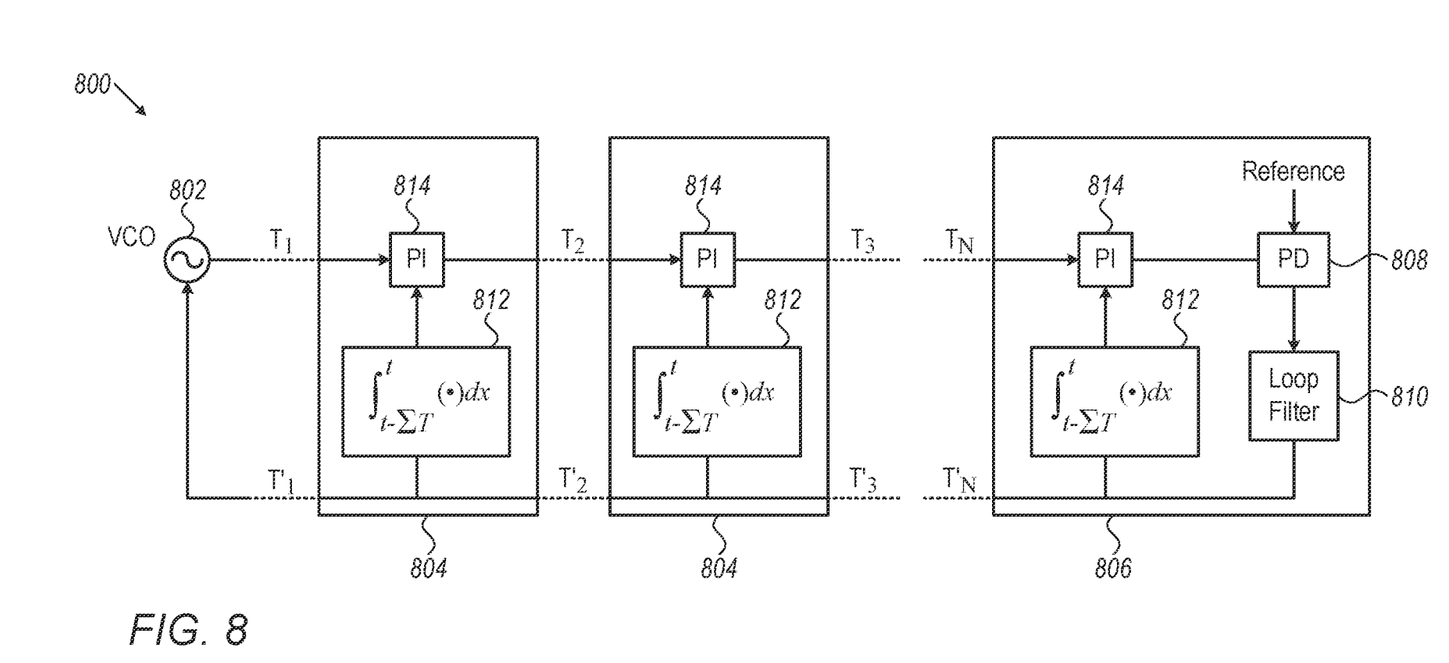
FIG. 8 is a block diagram that schematically illustrates a distributed PLL, in accordance with an embodiment of the present invention.

FIG. 8 is a block diagram that schematically illustrates a distributed PLL 800, in accordance with an embodiment of the present invention. The PLL comprises a VCO 802, which outputs a clock signal. The clock propagates through a plurality of consumers 804, and to a last consumer 806. The last consumer comprises a phase-detector (PD) 808 and a loop filter 810. The loop filter output propagates to the control input of VCO 802 through the chain of consumers, from the last consumer to the first, and from the first consumer to the VCO.

According to the example embodiment illustrated in FIG. 8, the clock signal comprises internal delays; the delay from the VCO to the first consumer 804 is designated T1, the delay from the first consumer to the second consumer is designated T2, and so on. On a similar manner, the delay of the VCO 802 control voltage from the first consumer 804 is designated T'1, the delay from the second consumer to the first consumer is designated T'2, and so on. If there are N consumers (including last consumer 806), the clock input to the $i^{th}$ consumer is designated $T_i$ (and, thus, the input to the last consumer 806 is designated $T_N$). Similarly, the VCO control voltage that the $i^{th}$ consumer output is designated $T'_i$.

To compensate for the delays, each consumer 804, including the last consumer 806, comprises and integrator 812 and a phase interpolator 814. The integrator integrates the VCO control signal that the consumer receives, from $t-T_{sum}$ to t, wherein, for each consumer 804, $T_{sum}$ is the sum of delays $T_i$ and $T'_i$ from the VCO to the consumer. The PI subtracts the output of the integrator from the propagated signal.

The configurations of PLL 700 and distributed PLL 800, illustrated in FIGS. 7, 8 and described hereinabove are example configurations that are cited for the sake of conceptual clarity. Other configurations may be used in alternative embodiments. For example, in some embodiments, the distributed PLL has a star architecture for the clock propagation; the delays $T_i$ of the integrators are changed accordingly.

Compensating for Clock and Data Recovery (CDR) Delay

In embodiments, a CDR circuit receives a signal that is modulated by a clock, and extracts both the clock and the data. We will disclose hereinunder embodiments that compensate for the intrinsic delay of CDR circuits. In the disclosed embodiments, all processing is done in the digital domain—the input signal is converted to digital at the very first stage; a single exception is a digitally controlled oscillator (DCO), which receives a digital control input and outputs a sampling clock. Embodiments of the present invention, however, are not limited to digital domain CDRs; in embodiments any or all the CDR circuitry may be analog, digital or, when applicable, mixed analog-digital.

Figure 9A:
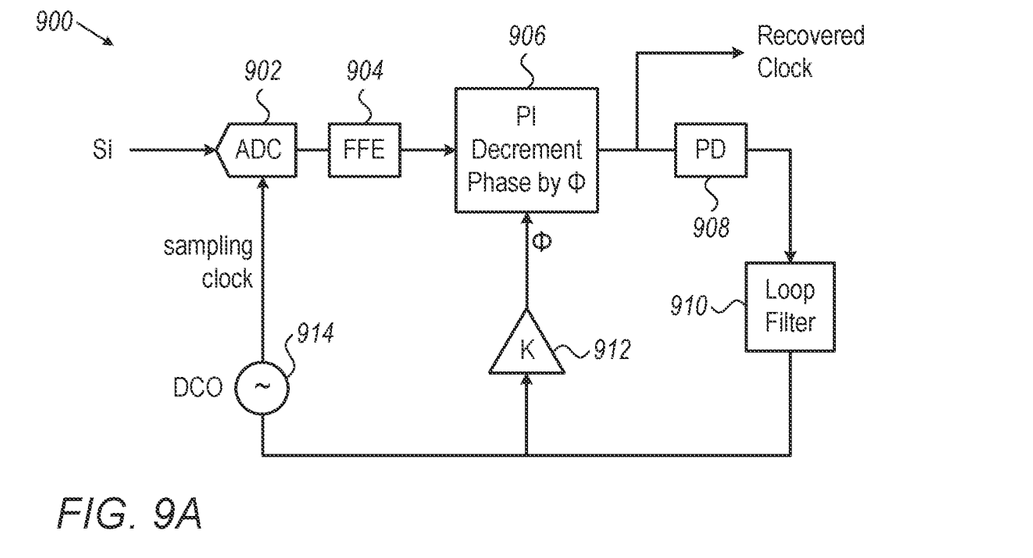
FIG. 9A is a block diagram that schematically illustrates a Clock-Data-Recovery (CDR) circuit, in accordance with a first CDR embodiment of the present invention.

FIG. 9A is a block diagram that schematically illustrates a Clock-Data-Recovery (CDR) circuit 900, in accordance with a first CDR embodiment of the present invention. A high-speed signal that contains clock and data is input to an ADC 902. The digital output of the ADC is input to a Feed-Forward Equalizer (FEE) 904. FFE 904 is typically a finite-impulse-response (FIR) filter, comprising a plurality of delayed taps and outputting a weighted averages of the input signal and the outputs of the delayed taps. To compensate for the CDR delay, a Phase Interpolator (PI) 906 subtracts a phase t from the output of the FFE, to generate the recovered, delay-compensated, clock output.

A Phase-detector 908 detects the phase of the recovered clock relative to a reference clock (not shown). The detected phase is input to a loop-filter 910; the output of the loop-filter (e.g., the feedback signal) is used as the control input of a DCC 914 (DCC 914 includes an accumulator that integrates the phase input). The signal that DCC 914 outputs is the sampling clock with which ADC 902 samples the input signal.

To compensate for the control loop delay, a multiplier 912 multiplies the loop filter output by a constant K, to generate a phase $\Phi$, which is subtracted from the FFE output by PI 906. (In CDR 900, the delay integrator is approximated by the value of the LPF output at time t, multiplied by a constant K. This technique was described above, with reference to FIG. 2.)

Figure 9B:
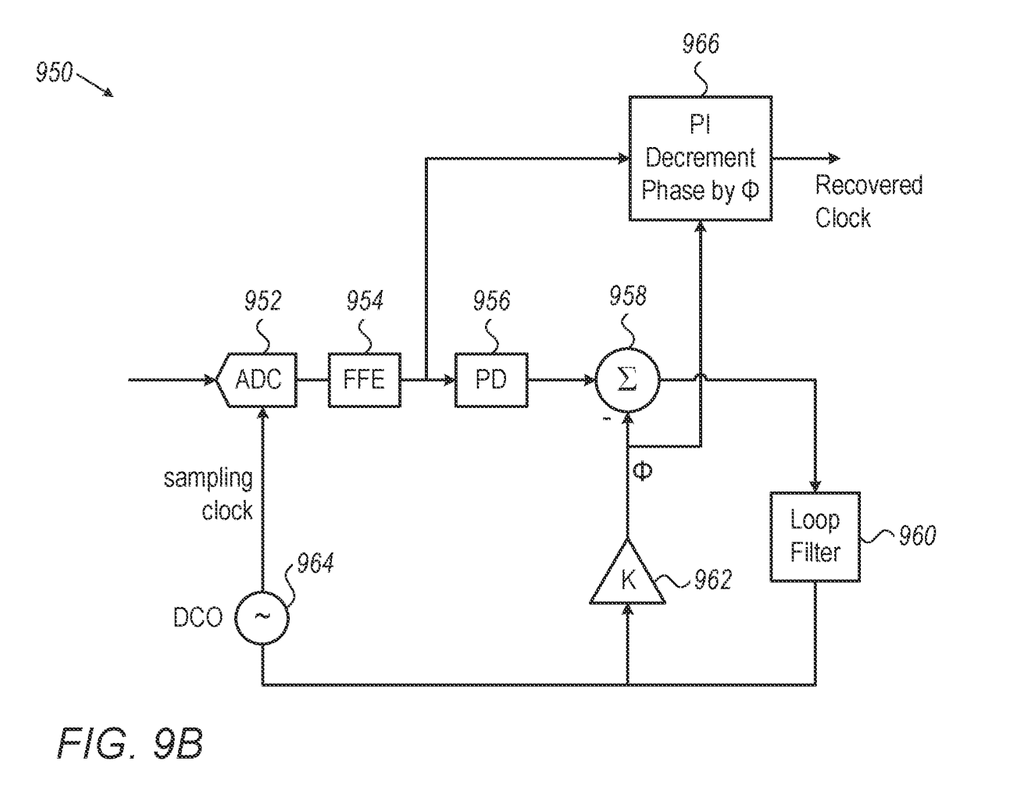
FIG. 9B is a block diagram that schematically illustrates a CDR circuit, in accordance with a second CDR embodiment of the present invention.

FIG. 9B is a block diagram that schematically illustrates a CDR circuit 950, in accordance with a second CDR embodiment of the present invention. Like CDR 900, CDR 950 comprises an ADC 952, and FFE 954, a PD 956, a PI 966, a loop filter 960, a multiplier 962 and a DCO 964. When compared to CDR 900, CDR 950 has the same output characteristics but a shorter loop delay. This is achieved by a subtractor 958, which subtracts the phase $\Phi$ from the output of PD 956. The output of subtractor 958 is input to the loop-filter.

Figure 9C:
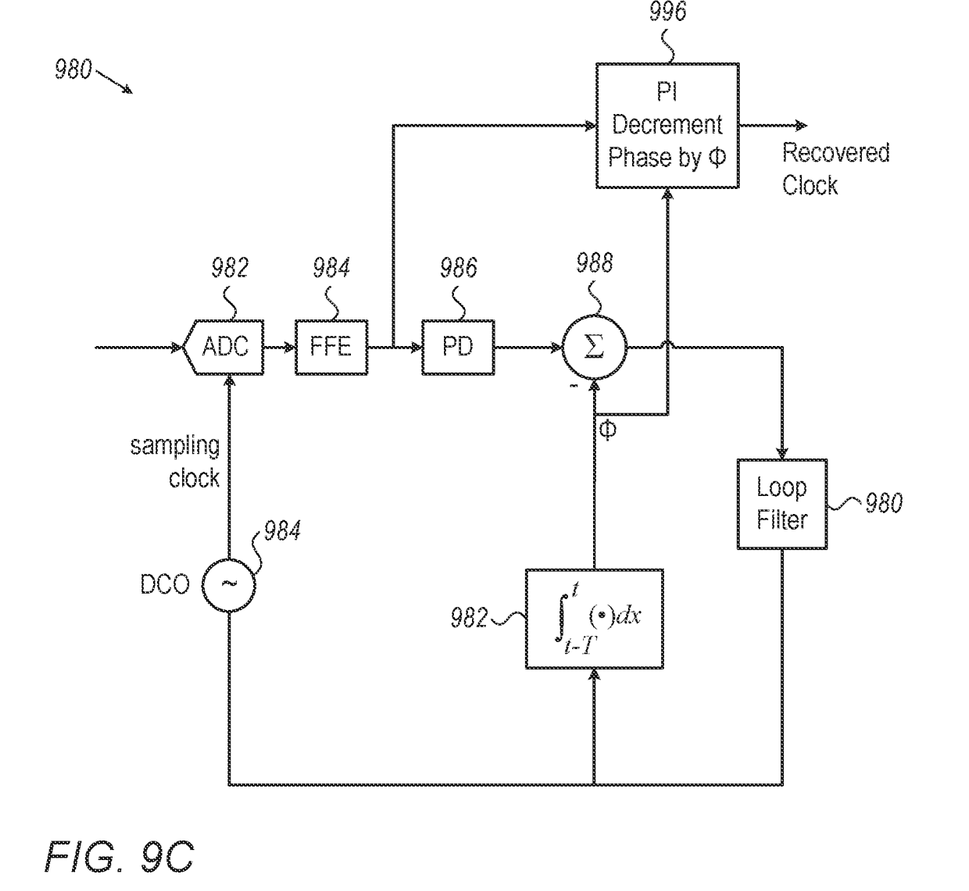
FIG. 9C is a block diagram that schematically illustrates a CDR circuit, in accordance with a third CDR embodiment of the present invention.

FIG. 9C is a block diagram that schematically illustrates a CDR circuit 980, in accordance with a third CDR embodiment of the present invention. Like CDR 900, CDR 980 comprises an ADC 982, and FFE 984, a PD 986, a PI 996, a loop filter 980, and a DCO 984. When compared to CDR 900, CDR 980 comprises a feedback integrator that integrates the feedback signal, to be subtracted by a subtractor 988 from the PD output.

The configurations of CDR 900, CDR 950 and CDR 980, illustrated in FIGS. 9A, 9B, 9C and described hereinabove are non-limiting configurations given purely by way of example. Other configurations may be used in alternative embodiments. For example, in some embodiments, one or more of DCOs 914, 964 are replaced by a VCO, with a digital to analog converter at the input. In some embodiments, other equalizers, in addition or instead of FFEs 904, 954 are used, such as a Continuous Time Linear Equalizer (CTLE).

The apparatuses and methods described hereinabove, with reference to FIGS. 1 through 9B; the configurations of FCLs 100, 200, 300, 400; the configurations of PLL 700, 800; the configurations of CDRs 900, 950 and the method of flowchart 600, including all units and subunits thereof, are example configurations and methods that are shown purely for the sake of conceptual clarity. Any other suitable methods and configurations can be used in alternative embodiments.

In various embodiments, FCLs 100, 200, 300, 400, PLLs 700, 800 and CDRs 900, 950 may be implemented using suitable hardware, such as one or more Application-Specific Integrated Circuits (ASIC) or Field-Programmable Gate Arrays (FPGA), or a combination of ASIC and FPGA. In some embodiments, the disclosed FCLs or parts thereof may be implemented in software that is run on one more general-purpose processors, which are programed in software to carry out at least a part of the FCL functions described herein. The software may be downloaded to the processors in electronic form, over a network, for example, or it may, alternatively or additionally, be provided and/or stored on non-transitory tangible media, such as magnetic, optical, or electronic memory.

Although the embodiments described herein mainly address feedback loops with delay, the methods and systems described herein can also be used in other applications such as in DC tracking, Baseline wander compensation and any control loops with large delays.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Integrated Circuit (IC), comprising feedback control-loop (FCL) circuitry to generate a delay-compensated output signal responsively to a non-compensated output signal, the FCL circuitry comprising:
   a controlled oscillator, to generate the non-compensated output signal;
   a main feedback path, comprising a phase detector and a loop filter, to generate a main feedback signal responsively to the delay-compensated output signal, and to control the controlled oscillator using the main feedback signal;
   a delay-compensation feedback path, to generate a delay-compensation feedback signal that is indicative of a sum of (i) a first delay from an output of the controlled oscillator to an input of the phase detector and (ii) a second delay from an output of the loop filter to an input of the controlled oscillator; and a phase interpolator, which is controlled by the delay-compensation feedback signal and is to generate the delay-compensated output signal with a phase that is set to compensate for the sum of the first delay and the second delay.

2. The IC according to claim 1, wherein the delay-compensation feedback path comprises an integrator configured to approximate the sum of the first delay and the second delay.

3. The IC according to claim 1, wherein the delay-compensation feedback path comprises an accumulator configured to approximate the sum of the first delay and the second delay.

4. The IC according to claim 1, wherein the delay-compensation feedback path comprises a signal multiplier configured to approximate the sum of the first delay and the second delay.

5. The IC according to claim 1, wherein the FCL circuitry comprises a phase-locked-loop (PLL).

6. The IC according to claim 5, wherein the PLL is distributed.

7. The IC according to claim 5, wherein the PLL comprises a multistage distributed PLL.

8. The IC according to claim 1, wherein the FCL circuitry comprises a clock and data recovery (CDR) circuit.

9. A method for generating a delay-compensated output signal responsively to a non-compensated output signal, the method comprising:
   generating the non-compensated output signal using a controlled oscillator;
   using a main feedback path comprising a phase detector and a loop filter, generating a main feedback signal responsively to the delay-compensated output signal, and controlling the controlled oscillator using the main feedback signal;
   using a delay-compensation feedback path, generating a delay-compensation feedback signal that is indicative of a sum of (i) a first delay from an output of the controlled oscillator to an input of the phase detector and (ii) a second delay from an output of the loop filter to an input of the controlled oscillator; and
   using a phase interpolator, which is controlled by the delay-compensation feedback signal, generating the delay-compensated output signal with a phase that is set to compensate for the sum of the first delay and the second delay.

10. The method according to claim 9, wherein generating the delay-compensation feedback signal comprises approximating the sum of the first delay and the second delay using an integrator in the delay-compensation feedback path.

11. The method according to claim 9, wherein generating the delay-compensation feedback signal comprises approximating the sum of the first delay and the second delay using an accumulator in the delay-compensation feedback path.

12. The method according to claim 9, wherein generating the delay-compensation feedback signal comprises approximating the sum of the first delay and the second delay using a signal multiplier in the delay-compensation feedback path.

13. The method according to claim 9, wherein generating the delay-compensated output signal responsively to the input reference signal comprises operating a phase-locked-loop (PLL).

14. The method according to claim 13, wherein the PLL is distributed.

15. The method according to claim 13, wherein the PLL comprises a multistage distributed PLL.

16. The method according to claim 9, wherein generating the delay-compensated output signal responsively to the input reference signal comprises operating a clock and data recovery (CDR) circuit.

17. The IC according to claim 1, wherein the delay-compensation feedback signal estimates an integral of the main feedback signal, the integral taken over a time duration matching the sum of the first delay and the second delay.

18. The method according to claim 9, wherein generating the delay-compensation feedback signal comprises estimating an integral of the main feedback signal, the integral taken over a time duration matching the sum of the first delay and the second delay.

\* \* \* \* \*